United States Patent [19]
Mayor et al.

[11] Patent Number: 6,018,602
[45] Date of Patent: Jan. 25, 2000

[54] METHOD AND ARRANGEMENT FOR THE SPACE-BASED OPERATION OF QUANTUM-OPTICAL AMPLIFIERS EMBODIED AS OPTICAL WAVEGUIDES

[75] Inventors: Jean-Michel Mayor, Yverdon-les-Bains; Etienne Rochat, Yverdon; Karim Haroud, Chavannes sur Moudon, all of Switzerland

[73] Assignee: Oerlikon Contraves AG, Zurich, Switzerland

[21] Appl. No.: 09/103,485

[22] Filed: Jun. 24, 1998

[30] Foreign Application Priority Data

Jun. 25, 1997 [CH] Switzerland .......................... 1540/97

[51] Int. Cl.[7] ............................................. G02B 6/26
[52] U.S. Cl. ............................. 385/27; 385/147; 385/6; 385/11
[58] Field of Search ................... 385/27, 3, 6, 7, 385/11, 12, 13, 14, 15, 50, 147; 359/279

[56] References Cited

U.S. PATENT DOCUMENTS 5,031,984  7/1991  Eide et al. ................................. 385/27
5,896,219  4/1999  Wandernoth ............................ 359/279

FOREIGN PATENT DOCUMENTS 2 267 006  11/1993  United Kingdom .

OTHER PUBLICATIONS

Henschel et al., Radiation hardening of optical fibre links by photobleaching with light of shorter wavelength, *IEEE Transactions on Nuclear Science*, vol. 43, No. 3, Jun. 1996.

Duling, et al., Single–Polarisation Fibre Amplifier, *Electronic Letters* vol. 28, No. 12, Jun., 1992.

Annovazzi–Lodi et al., All–Fiber Faraday Rotator Made by a Multiturn Figure–of–Eight Coil with Matched Birefringence, *Journal of Lightwave Technology*, vol. 13, No. 12, Dec. 1995.

Goltsos, Radiation–Induced Loss Studies in Er–Doped Fiber Amplifier Systems, *SPIE* vol. 2699 pp. 304–309 May 1996.

Gilbert, Photobleaching of Radiation–Induced Color Centers in a Germania–Doped Glass Fiber, *IEEE Transactions on Nuclear Science*, vol. NS–29, No. 6, Dec. 1982.

Miyazaki et al., A high power Nd–doped double–clad fiber amplifier at 1.06 um, *SPIE*, vol. 2699 pp. 254–265 2699 pp. 254–265.

Hastings et al., Effects of Gamma Radiation on High–Power Infrared and Visible Laser Diodes, *IEEE Transactions on Nuclear Science*, vol. 43, No. 3, Jun. 1996, pp. 141–2149.

*Primary Examiner*—Phan T. H. Palmer
*Attorney, Agent, or Firm*—Townsend and Townsend and Crew LLP; Guy W. Chambers

[57] ABSTRACT

The instant invention relates to a method and an arrangement for the space-based operation of quantum-optical amplifiers embodied as optical waveguides, while taking the special conditions to be found in space into consideration. An amplifier housing 2 filled with nitrogen has a cutout into which a plan-parallel quartz glass plate 4 has been fitted, through which light beams can enter and leave the housing. The amplifier housing 2 rests on heat-insulating supports 3a, 3b and is temperature-stabilized by a Peltier element 5. The amplifier housing 2 is filled with nitrogen in order to achieve operating conditions similar to those on earth.

9 Claims, 4 Drawing Sheets

METHOD AND ARRANGEMENT FOR THE SPACE-BASED OPERATION OF QUANTUM-OPTICAL AMPLIFIERS EMBODIED AS OPTICAL WAVEGUIDES

FIELD OF THE INVENTION

The invention relates to method and arrangement for the space-based operation of quantum-optical amplifiers embodied as optical waveguides, taking into consideration the special conditions prevailing in space.

BACKGROUND OF THE INVENTION

The employment of satellites for communications and navigation purposes so far has been mainly marked by the use of individual or a few satellites, which are only in contact via microwave radio channels with the earthbound operator, or respectively user. However, in the future, increasingly larger groups of satellites will be placed in earth orbit for the same purpose, such as for communications systems, partially in the realization phase, which circle the earth at low altitudes. Their limited visibility requires the permanent forwarding of an earthbound user between a plurality of continuously passing satellites.

Maintaining communications past the area of visibility of a satellite takes place by the conveyance of information between the individual satellites of such a system which, for reasons of weight and space, most advantageously takes place in an optical manner. Considerable optical output is required here with fiber-optic communications, although in comparison with the output required for a microwave connection, it is still relatively low.

Diode-pumped solid-state lasers are advantageous because of the great coherence of their light emission, provided particularly energy efficient coherent transmission methods are used. With a high modulation bandwith, the external modulation of the phase of the light emitted by the laser required in this case must be performed by means of a modulator designed in the form of an optical waveguide, which cannot be operated at a high optical output. The transition from a solid-state laser emitting a collimated beam into a waveguide structure is considered to be critical and prone to losses, because of which an additional output reserve is required in the subsequent quantum-optical amplifier. The design of the later as a solid body amplifier involves further technical problems.

Thus, for a considerable utilization of the optical pump output generated by the diode lasers, it is necessary to provide a multitude of passages of the light to be amplified through the optically pumped zones of the solid body, which results in relatively large, high-mass and acceleration-sensitive apparatus. A mechanical temperature-stable acceleration-resistant structure is required in order to prevent the overlapping of pump light and signal light beams by external influences.

OBJECT AND SUMMARY OF THE INVENTION

It is therefore the object of the invention described below to avoid the disadvantages of the prior art mentioned, and to generate the required light output by means of a more efficient, space- and weight-saving quantum-optical amplifier.

In accordance with the instant invention, this object is attained by the use of fiber-optical waveguides containing quantum-optically amplifying medium. Diverging from the use of fibers doped with erbium, which had found widespread use in fiber-optical communications, a material doped with neodymium is used, as a result of which a four level system, the same as in the neodymium-YAG solid-state laser used as the source which is to be amplified, is created, which prevents the absorption of signal light in insufficiently optically pumped areas of the amplifying medium.

The optically amplifying optical waveguide is fastened by means of elastic straps on the wall of a housing filled with nitrogen, which selectively can also contain essential electronic components, for example laser diodes for optical pumping of the amplifier.

The nitrogen filling is used to create earth-like operating conditions. If a lack of convection permits it, it is possible to carry away locally created heat, and the outgassing of components in the vacuum can be prevented. Harmful outgassing is bound by means of appropriate agents.

Optical output can be beamed in the form of collimated beams into the housing as well as conducted out of it through quartz glass windows consisting of plan-parallel plates, this is selectably also possible via optical waveguides which are conducted in a gas-tight manner through the housing wall. To the extent that plan-parallel plates are provided as windows which, in particularly lightweight embodiments are replaced by an optical lens, for eliminating reflections in the polarization device employed, beam penetration is provided, depending on the embodiment, within the Brewster angle. Pump light, as well as light on the wavelength of the signal light or amplified signal light spontaneously emitted as a result of the absorption of the pump light, continuously flows through the amplifying optical waveguide used, regardless of the operational state of the entire optical transmission device.

By means of this a rapid bleaching of color centers is assured, which are created by the bremsstrahlung caused by particle radiation entering through the satellite body (H.Henschel et al. in "Radiation Hardening of Optical Fiber Links by Photobleaching with Light of Shorter Wavelength", IEEE Transact on Nuclear Science, 1996, p. 1050), In general, color centers considerably increase the optical damping of optical waveguides. The polarization of the light leaving the optical amplifier is electronically controlled by means of a magnetic field generated by coils and acting along the fiber direction. In a particularly compact design it is provided to utilize the amplifying optical waveguide in both directions of propagation, wherein the polarization of the signal light to be amplified is reflected, turned by 90, at one end of the optical waveguide and returns orthogonally polarized (I. N. Duling, R. D. Esman, "Single-Polarization Fiber Amplifier" in EI. Lett., 1992, p. 1126). The input and the output of the amplifier are separated at the other end of the optical waveguide by means of a polarization beam splitter. An optical waveguide, which has a reflecting layer at one end and is present in a defined manner in one or several superimposed magnetic fields, is used for rotating the polarization (V. Annovazzi-Lodi et al., "All-Fiber Faraday Rotator, Made by a Multiturn Figure-Eight Coil with Matched Bi-refringence", in IEEE JLT, 1995, p. 2349). The quantum-optical amplifier is integrated in a special embodiment in this optical waveguide. In cross section, the optical waveguide itself consists of several layers, wherein a core layer only conducts an electrodynamic mode of the signal light, while another layer forms a multi-mode waveguide, together with a shell layer, into which the pump light can be coupled with high efficiency. Its coupling takes place via collimated beams of individual laser diodes which, making use of overlapping in both orthogonal directions, but not otherwise overlapping, are guided in close vicinity in respect to each other in the multi-mode waveguide, so that interfering superimposition effects are prevented to a large degree.

By means of a larger number of laser diodes generating pump light, it is possible to operate them with a clearly increased service life, since particle radiation and bremsstrahlung release additional charge carriers in the semiconducting zones, which during normal operation trigger damaging current density peaks (M. C. Hastings et al. "Effects of Gamma Radiation on High-Power Infrared and Visible Laser Diodes", in IEEE Trans. on Nuclear Science, 1996, p. 2141). In addition, there is a better adaptation of the low operating voltage of an individual laser diode to the on-board voltage level of the satellite by connecting them in series. The regulation of the light output here takes place by the regulation of a short-circuit current flowing parallel to the individual diode. The resulting advantages are, for one, the lower weight in comparison with a solid-state crystal amplifier, and the compatibility with electro-optical modulators built in the form of waveguides.

The advantageous, efficient utilization of the pump light is assured by its perfect overlapping with the light to be amplified over the very long distance of the optical waveguide. The great utilization of the pump light is additionally assured by the high intensity of the light to be amplified in the waveguide, and therefore a high rate of stimulated emissions. In an arrangement operated with a Faraday rotator, the stability of the polarization and the length thereof, shorter by one half on account of the twofold utilization of the optical waveguide, should furthermore be mentioned. In addition, the inversion of both orthogonal polarization directions is used which, besides a further increase in efficiency, causes a comparatively small amount of interfering spontaneous emissions.

Further details, features and advantages of the invention result not only from the claims and the characteristics to be taken from them, by themselves and/or in combination, but also from the following description of a preferred embodiment.

DETAILED DESCRIPTION OF THE PREFERRED EMBODIMENTS

Figure 1:
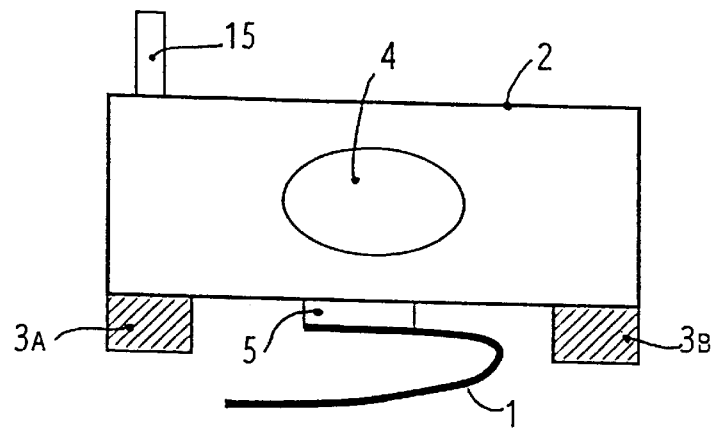
FIG. 1 is a front view of an amplifier housing filled with nitrogen.

The front view of an amplifier housing 2, represented in FIG. 1, filled with nitrogen, has a cutout into which a planparallel quartz glass plate 4 has been fitted, through which the light beams can enter and leave the housing. The amplifier housing 2 rests on heat-insulated supports 3a, 3b and is temperature-stabilized by means of a Peltier element 5, whose side which is not connected with the amplifier housing 2 is connected with a heat- or respectively cold sink by means of a strap 1, to conduct heat. The amplifier housing 2 is filled with nitrogen, or with a gas with comparable favorable properties, in order to achieve operating conditions similar to those on earth. Reference is made to heat removal as well as outgassing from various materials in a vacuum.

A parallel operation of an amplifier located in a vacuum is conceivable as a long-term experiment, but the described arrangement has the advantage of increased dependability in view of the lack of a sufficient amount of experience in connection with long-term operation of fiber-optical elements in space. To minimize the mechanical load on the amplifier housing 2, the gas filling can take place at half the pressure found on the ground. But filling under overpressure is also provided, which during the ascent phase of a satellite is vented through an overpressure valve 15 until a previously determined pressure has been reached.

Figure 2A:
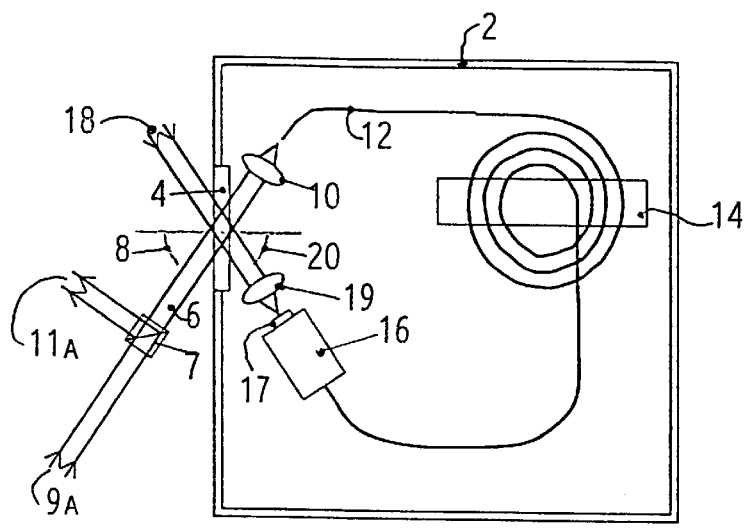
FIG. 2a is a first exemplary embodiment in accordance with the invention in the form of an opened amplifier housing.

The second exemplary embodiment of the opened amplifier housing 2 represented in FIG. 2a makes clear the mode of operation of the arrangement by means of the component seated therein. A collimated light beam 9a from a solid-state laser, not shown for reasons of clarity, which is used as the light source, passes through a polarization beam splitter 7 without being deflected, in order to be coupled over a further propagation path 6 through the quartz glass plate 4 as well as a first lens 10 into an optical waveguide 12, which is fixed by means of an elastic strap 14 on the bottom of the housing. The optical waveguide 12 contains the amplifying medium, which is optically pumped through another end of the optical waveguide by means of a pump light beam 18. The pump light beam 18 is coupled in via a second lens 19 through a layer 17 at the end of the optical waveguide 12 drawn through a device 16, which acts in a reflecting manner on the amplified light coming from the solid body laser, but is non-reflecting for the pump light. During a double passage of the light to be amplified, the device 16 causes a rotation of the polarization by 90 degrees, which is reproduced on the inlet of the optical waveguide 12 located near the lens 10, because of which the amplified light leaves the amplifier via the propagation path 6 and the polarization beam splitter 7 in the form of a deflected beam 11a. An angle 8 of the propagation path 6 to the surface of the quartz glass plate 4 can assume the value of the Brewster angle (is optimized) for the incoming beam 9a in order to prevent reflections. The polarization beam splitter 7 can also be embodied in the form of a polarization-selective fiber-optical coupler attached to the optical waveguide 12, so that the direct connection of a phase modulator embodied in a waveguide shape is made possible.

Figure 2B:
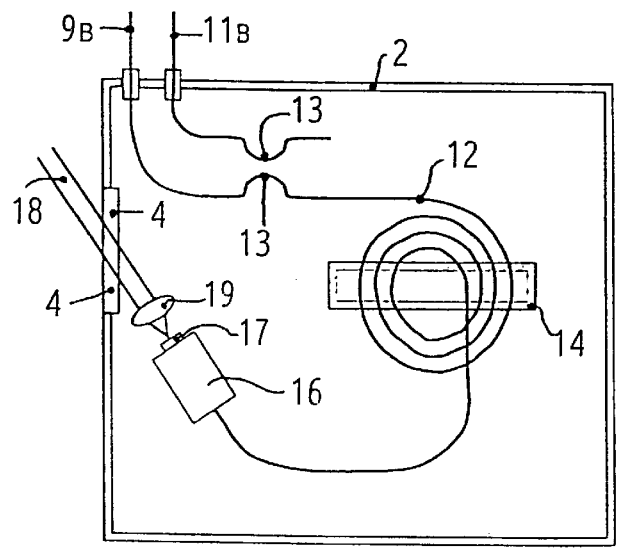
FIG. 2b is a second exemplary embodiment in accordance with the invention in the form of an opened amplifier housing.

Such a modification can be seen in FIG. 2b. A further simplification of the design results from the guidance of the collimated light beams 9a and 11a (from FIG. 2a) in polarization-maintaining optical waveguides 9b and 11b, particularly since the polarization-selective fiber-optical coupler 13 can be designed lighter and more space-saving than the polarization beam splitter 7. Essentially the coupler 13 consists of two optical waveguides, which are conducted close to each other, are highly birefringent and as a result polarization-maintaining, in which light guided in a defined polarization direction is coupled over into respectively adjacent optical waveguides, but is omitted in the polarization direction which is orthogonal to this. The reason for this lies in matched phase speeds of both optical waveguides in case of coupling which, with a polarization which is orthogonal with this, strongly differ between the two waveguides. In this way appropriately polarized light, which is conveyed in the waveguide 9b in the direction toward the amplifier, is not coupled over in the coupler 13 and is guided into the optical waveguide 12 containing the amplifying medium. The lightwave, which is reflected out of the arrangement constituted by the optical waveguide 12, the device 16 and the layer 17, is conducted in the opposite propagation direction into the coupler 13, but now, as a result of its now orthogonal polarization, it is coupled over into the optical waveguide 11b which leads away.

Figure 2C:
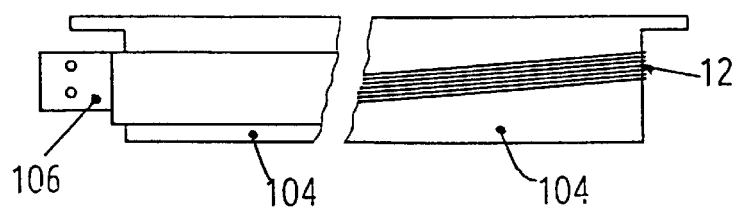
FIG. 2c is a third exemplary embodiment in accordance with the invention in the form of an opened amplifier housing.

In accordance with FIG. 2c, the optical waveguide 12 can also be operated in a vacuum under thermally controllable homogeneous conditions. To this end the optical waveguide 12, which has been spun into a braid-like plait made of fibers which are very thin and capable of conducting heat, is wound on a body 104 capable of conducting heat and fixed in place by means of a strip-like body 106 whose shape is matched to that of the body 104. The temperature of the body 104 can be regulated by appropriate means. An additional possibility consists in winding the optical waveguide 12, which at most is provided with a thin protective layer and is wound on a rounded body, with several layers of a thin Teflon strip, which sticks to itself without adhesives because of its cohesion.

Figure 3:
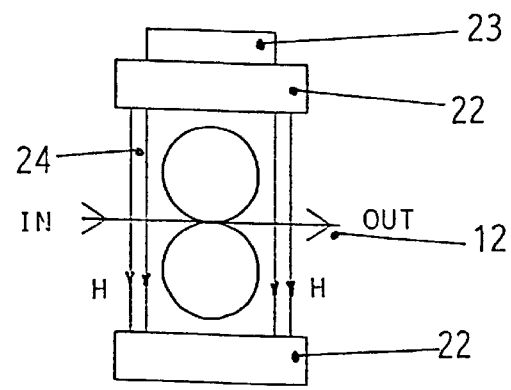
FIG. 3 is an exemplary embodiment of a Faraday rotator.

The device 16 for rotating the polarization of the light to be amplified is represented in FIG. 3 and essentially consists of a number of turns of the optical waveguide 12 made in the form of a figure eight which, in the represented orientation are located in a permanent magnetic field 24 between poles 22 of a permanent magnet. By means of the controlled introduction of the double refraction and the repeated polarization turns of the passing light caused by this in phase with the magnetic field 24, which alternatively occurs in respect to the propagation direction, a continuous Faraday rotation occurs, which is 45° per passage and adds up to 90° with the reflected light. An additional electromagnet 23 is used for the later adjustment of the device in the course of the mission by changing the magnetic field 24.

Figure 4:
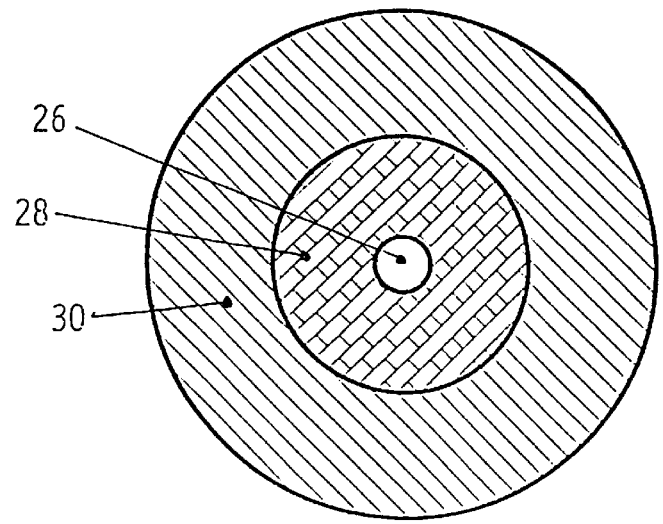
FIG. 4 is a schematic representation of a refractive index profile of an optical waveguide used in the quantum-optical amplifier.

In cross section, FIG. 4 shows zones with different refraction coefficients of the optical waveguide 12 used in the arrangement in accordance with FIG. 2a, which shows the highest optical refraction coefficient inside a circular zone 26. The latter is enclosed by a further zone 28, whose refraction coefficient is only slightly less, so that in spite of their relatively great expanse, both zones 26 and 28 only carry one electrodynamic mode of the light to be amplified. A zone 30 enclosing both zones 28 and 26 has a considerably lower refraction coefficient, so that, together with the zones 26 and 28, a multi- mode optical waveguide is formed, through which the pump light is conducted. Therefore the latter floods the zone 26 containing the gain-producing medium, through which the light to be amplified is conducted.

Figure 5A:
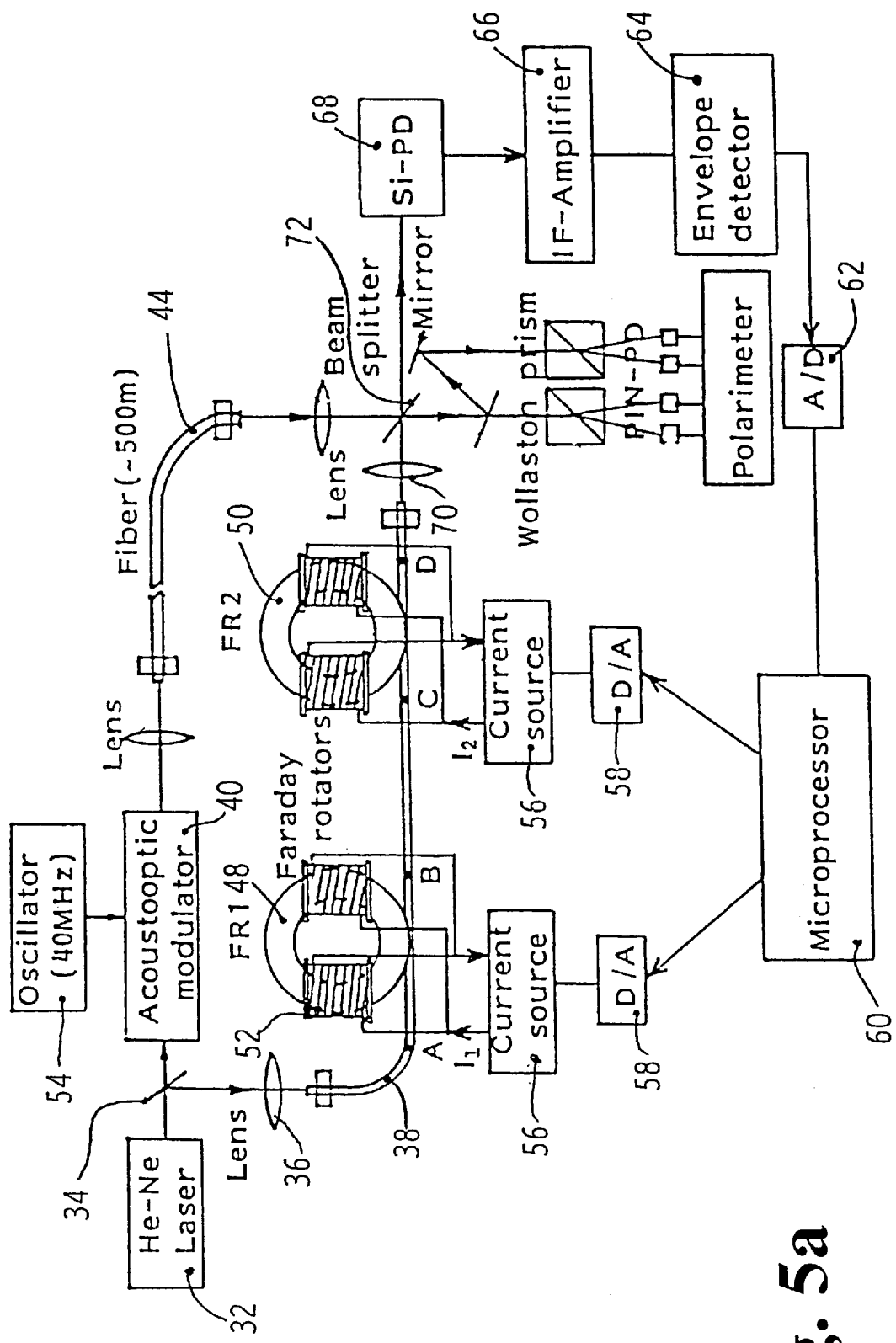
FIG. 5a is an arrangement for electronic regulation of the polarization of a lightwave being propagated in an optical waveguide.

By means of a test structure, FIG. 5a shows a further principle for controlling the polarization of a lightwave generated by a laser 32 and being propagated in an optical waveguide 38. The light emitted by the laser 32 is split into two partial beams by means of a partially transparent mirror 34, wherein a portion of this light beam is conducted through an acousto-optical modulator 40, wherein the optical frequency of the latter is displaced by the amount of the frequency of the oscillator 54. A second portion of the light beam is coupled into an optical waveguide which is wound in two coils 48 and 50, which are enclosed in electrical coils 52. The latter are supplied via current sources 56, so that a magnetic field is created in the coils 48 and 50 in the propagation direction of the coupled-in lightwave, which generates a Faraday rotation. Subsequently, following the out coupling from the optical waveguide 38, the light beam created in this manner is brought together via a lens 70 with the frequency-shifted first partial beam, which is brought forward via an optical waveguide 44, by means of a partially transparent mirror 72. Both partial beams are detected, superimposed on each other, in a photo-detector 68 wherein, in case of identical polarization, an electrical wave is generated which has the frequency of the oscillator 54. After passage through an amplifier 66, which preferably amplifies this frequency, and an envelope detector 64, the d.c.-voltage generated by the latter is conducted to an analog/digital converter, whose measured values are supplied to a microprocessor 60. Via a digital/analog converter 58, the output data of the latter affect the set values of current sources 56 supplying the electrical coils 52, and therefore, via the resultant size of the Faraday rotation, the polarization of the lightwave leaving the optical waveguide 38.

One method for manipulating the polarization of a lightwave being propagated in both modes, which are orthogonal with each other, in an optical waveguide, is the rotation of two optical waveguide loops used to replace the quarter-wave plates used with collimated light beams being propagated in free space. By means of this the increased birefringence of the optical waveguide resulting from the winding of the optical waveguide is used for displacing the phase of the lightwaves in both modes, which are orthogonal with each other, by 90 degrees in respect to each other.

Figure 5B:
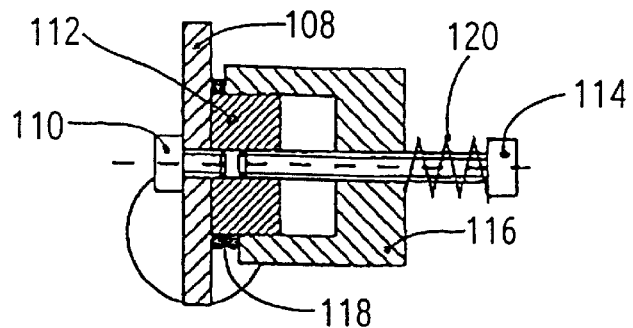
FIG. 5b is a device for adjusting the birefringence in optical waveguide loops, FIG. 6 as an arrangement for electric supply to pump light-generating laser diodes.

It is possible in addition to exert a pressure laterally on the rotatable loop for the exact setting or control of the birefringence. FIG. 5b shows a device suitable for this. A wound optical waveguide 118, resting on a base plate 108, wound around a cylinder 112 mounted by means of a threaded bolt 110 on the plate, is subjected by means of a further cylindrical body 116 to mechanical pressure, which is derived between a further cylinder screw 114 used for fastening the body 116 and a tensed helical spring 120 located on the body 116. It is of course possible to apply more than one winding of the optical waveguide 118 to the body 112. In place of a helical spring, the mechanical pressure can also be applied by electro-mechanical means. Thus a body 112 made of a piezo-electrical material is provided, besides electro-magnetic devices, whose extension is changed in the direction toward the threaded bolt 114 by applying an electrical voltage.

Figure 6:
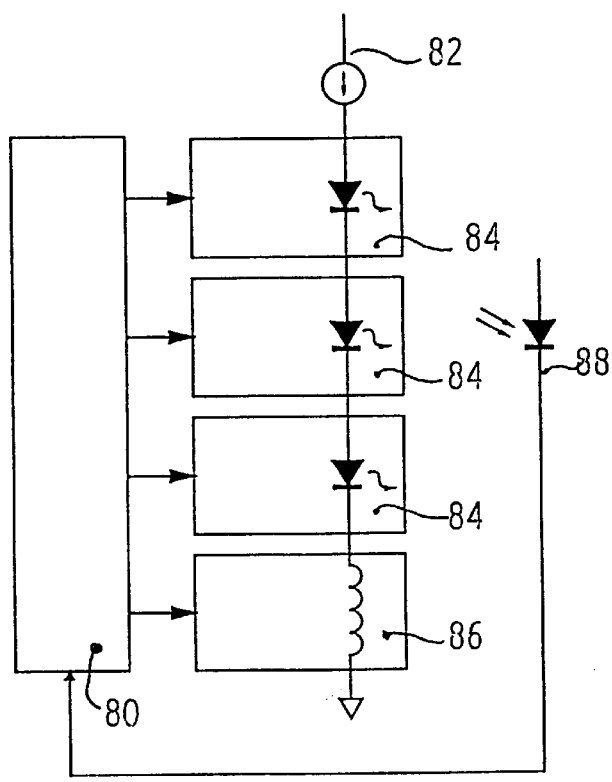

FIG. 6 shows a block circuit diagram of a current supply and an optical output control unit for the laser diodes of the quantum-optical amplifier generating the pump light output. The laser diodes are integrated into circuit blocks 84, through which a current generated in a source 82 flows. Since the required current strength is quite high, but the operational voltage of the blocks is relatively low, placing all operated or redundantly provided circuit blocks 84 in series and matching them to the on-board voltage of the satellite has proven to be the most advantageous method in respect to energy. This applies both to the generated waste heat and the electrical energy consumption, which needs to be minimized. In order to be able to regulate the current flow through the individual laser diodes integrated in the circuit blocks 84 in spite of the fixed current emanating from the source 82, a portion of the current flowing through the individual circuit block 84 is bypassed in the latter around the laser diode as needed. The regulation of the current actually flowing through the individual laser diodes is performed through a control unit 88 which, by means of a photodiode 80, measures the light output generated by all laser diodes, and which obtains data regarding the light output of the individual laser diodes from photodiodes attached to the individual laser diodes in the individual circuit blocks 84. Furthermore, it is provided to replace the laser diode by the connectors for the coils provided for the polarization control in one or several of said circuit blocks, wherein one or several photodiodes together with the polarization filters provide the corresponding actual value.

Figure 7:
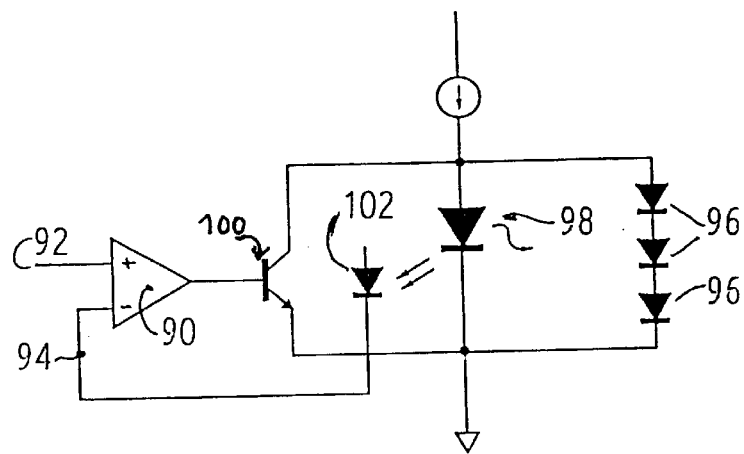
FIG. 7 is a simplified circuit diagram of a control circuit for controlling the electrical supply of a laser diode.

The circuit block 84 is represented in the form of a regulator in FIG. 7, i.e. in this case no information regarding the operational status of a laser diode 98 flows into the control unit 80. The set value of the photocurrent generated by the laser diode 98 is sent in the form of an electrical voltage to the non-inverting input 92 of an operational amplifier 90, wherein an inverting input 94 of this operational amplifier is provided with the actual value of the photocurrent, which is generated in a suitably wired photodiode 102, in the form of an electrical voltage. The matching of the actual and the set values leads to an output voltage of the operational amplifier 90 which, by means of an appropriately wired transistor 100, leads to a short-circuit current which is proportional to this and bridges the connections of the laser diode 98. Short-circuiting the laser diode 98 only causes the upward regulation of the current flowing through the transistor, while an outage of the conductivity of the laser diode 98 leads to an upward regulation of the current flowing through the transistor 100, also because of the lacking photo flow. The total outage of these two current paths is recovered by means of the series connection of semiconductor diodes 96, which is parallel with this.

What is claimed is:

1. A quantum-optical amplifier embodied as an optical waveguide which can be operated in space, comprising an optical waveguide wherein the light to be amplified by an amplifier moves in both directions through said optical waveguide, one end of said optical waveguide is covered by a layer which acts reflectively on the light to be amplified, but lets pump light pass without reflecting it, the reflection of the light to be amplified is accompanied by a polarization rotation of 90° caused by a Faraday rotator, the Faraday rotator is provided by windings of said optical waveguide or by conducting a portion of said optical waveguide through a magnetic field, wherein said Faraday rotator has a polarization-selective, fiber-optical coupler for separating light to be amplified, which flows into and out of said amplifier.

2. A quantum-optical amplifier embodied as an optical waveguide which can be operated in space in accordance with claim 1, wherein said optical waveguide is placed in a housing, sealed in a gas-tight manner and filled with a gas.

3. A quantum-optical amplifier embodied as an optical waveguide which can be operated in space in accordance with claim 2, wherein said gas filling has one-half the pressure of the earth atmosphere.

4. The quantum-optical amplifier embodied as an optical waveguide which can be operated in space in accordance with claim 1, wherein a braid-like thin plait is spun around said optical waveguide and said optical waveguide is wound on a body capable of conducting heat.

5. The quantum-optical amplifier embodied as an optical waveguide which can be operated in space in accordance with claim 1, wherein said optical waveguide is enclosed in a thin protective layer, and is embodied as a multi-layered winding.

6. The quantum-optical amplifier embodied as an optical waveguide which can be operated in space in accordance with claim 1, further comprising means for controlling the polarization of the lightwave which is being propagated in the optical waveguide.

7. The quantum-optical amplifier embodied as an optical waveguide which can be operated in space in accordance with claim 1, further comprising means in the form of a mechanical application of pressure in said optical waveguide for controlling and adjusting the double refraction of the lightwave which is being propagated.

8. A quantum-optical amplifier embodied as an optical waveguide which can be operated in space comprising an optical waveguide wherein light to be amplified by an amplifier moves in both directions through said optical waveguide, one end of said optical waveguide is covered with a layer which acts reflectively on the light to be amplified, but lets pump light pass without reflecting it, the reflection of the light to be amplified is accompanied by a polarization rotation of 90° caused by a Faraday rotator, said Faraday rotator is provided by windings of the optical waveguide or by conducting a portion of said optical waveguide through a magnetic field, wherein the separation of light to be amplified flowing into and out of said amplifier takes place by means of a polarization beam splitter.

9. A method for the space-based operation of quantum-optical amplifiers embodied as optical waveguides comprising the steps of permanently supplying a sufficient amount of light energy to the optical waveguide so that color centers generated by a bremsstrahlung are bleached out.

* * * * *